United States Patent [19]
Park

[11] Patent Number: 5,389,560
[45] Date of Patent: Feb. 14, 1995

[54] PROCESS FOR PRODUCTION OF STACKED CAPACITOR OF SEMICONDUCTOR DEVICE

[75] Inventor: Cheol S. Park, Bubaleub, Rep. of Korea

[73] Assignee: Hyundai Electronics Industries Co., Ltd., Kyoungkido, Rep. of Korea

[21] Appl. No.: 173,345

[22] Filed: Dec. 23, 1993

[30] Foreign Application Priority Data

Dec. 31, 1992 [KR] Rep. of Korea ............... 1992-27322

[51] Int. Cl.[6] ................. H01L 21/70; H01L 27/00
[52] U.S. Cl. .............................. 437/52; 437/60; 437/919
[58] Field of Search .............. 437/189, 195, 225, 228, 437/187, 47–48, 52, 60, 919

[56] References Cited
U.S. PATENT DOCUMENTS 5,268,322  12/1993  Lee et al. ..................... 437/52

*Primary Examiner*—George Fourson
*Assistant Examiner*—H. Jey Tsai
*Attorney, Agent, or Firm*—Darby & Darby

[57] ABSTRACT

A process for production of a stacked capacitor of a semiconductor device. This process achieves security of a sufficient capacitance of the capacitor of the semiconductor device having a high integration degree as well as a desired reliability of the semiconductor device. In accordance with this process, first and second mask polysilicon layers, which are used in opening of a storage node contact, are used in forming of a contact and also used as conductive layers for charge storage electrodes. The process of this invention provides the capacitor of the semiconductor device with a larger storage node capacitance in a relatively smaller cell area, using the characteristic of a higher etching selection ratio (about 30:1) of an oxide layer to a polysilicon layer and of a higher etching selection ratio (not less than 30:1) of the polysilicon layer to a nitride layer.

10 Claims, 13 Drawing Sheets

PROCESS FOR PRODUCTION OF STACKED CAPACITOR OF SEMICONDUCTOR DEVICE

BACKGROUND OF THE INVENTION

1. Field of the Invention

The present invention relates in general to production of a semiconductor device and, more particularly, to a process for production of a stacked capacitor of a semiconductor device having a high integration degree not exceeding 0.5 $\mu m$.

2. Description of the Prior Art

It is well known to those skilled in the art that as the integration degree of a semiconductor device is more increased, the cell area is more rapidly reduced, so that security of a desired capacitance of a capacitor in a small cell area becomes an important factor together with the lithography technique. Particularly in the case of forming contacts of a semiconductor device having a higher integration degree not exceeding 0.4 $\mu m$, there is attended with a serious difficulty in opening the contacts using a conventional direct contact forming process. That is, the serious difficulty, such as short of a storage contact, snort of word line, short of bit line or technical limitation of the lithography, is introduced in opening of the storage node contact of the semiconductor device of the high integration degree. Furthermore, security of capacitance per a unit cell required in driving of the cell in a small area inevitably introduces several serious problems.

SUMMARY OF THE INVENTION

It is, therefore, an object of the present invention to provide a process for production of a stacked capacitor of a semiconductor device in which the aforementioned problems can be overcome and which achieves security of a sufficient capacitance of a capacitor of a semiconductor device having a high integration degree as well as a desired reliability of the semiconductor device.

In order to accomplish the above object, a process for production of a stacked capacitor of a semiconductor device in accordance with a preferred embodiment of the present invention comprises the steps of: forming a first insulating layer and a second insulating layer on a transistor structure one by one, the transistor structure resulting from forming of a device separating oxide layer, a gate oxide layer, a gate electrode, a spacer oxide layer, a source region and a drain region on a semiconductor substrate; b) forming a bit line, contacting with the drain region, by etching the second insulating layer and the first insulating layer on the drain region after patterning of a bit line contact and, thereafter, forming a third insulating layer and a fourth insulating layer on the result structure one by one; c) forming a first conductive layer, a first buffer oxide layer, a second conductive layer and a fifth insulating layer on the result structure of the b) step one by one and, thereafter, developing a first photoresist film used as a storage node contact mask; d) etching the fifth insulating layer, the second conductive layer, the first buffer oxide layer and the first conductive layer one by one and, thereafter, removing the first photoresist film; e) forming a conductive layer on the result structure of the d) step and, thereafter, etching the result structure entirely for forming a spacer on the structure; f) etching the fourth insulating layer, the third insulating layer, the second insulating layer and the first insulating layer one by one, thereby forming a contact hole exposing the source region to the outside; g) forming a third conductive layer and a second buffer oxide layer on the result structure of the f) step one by one and, thereafter, etching the structure for remaining the second buffer oxide layer with a predetermined size; h) forming a fourth conductive layer, a sixth insulating layer used as an etching resist material and a second photoresist film on the result structure of the step g) one by one and, thereafter, developing the second photoresist film using a storage node mask such sized in its width that it completely covers the second buffer oxide layer; i) etching the sixth insulating layer, the fourth conductive layer, the third conductive layer and the second conductive layer; j) removing the second photoresist film and removing all of the first and second buffer oxide layers and, thereafter, partially etching the first conductive layer for trimming the first conductive layer to a predetermined size; and k) etching the sixth insulating layer for removing this layer and, thereafter, applying a capacitor dielectric layer and forming a plate electrode.

BRIEF DESCRIPTION OF THE DRAWINGS

The above and other objects, features and other advantages of the present invention wall be more clearly understood from the following detailed description taken in conjunction with the accompanying drawings, in which.

DESCRIPTION OF THE PREFERRED EMBODIMENTS

Figure 1:
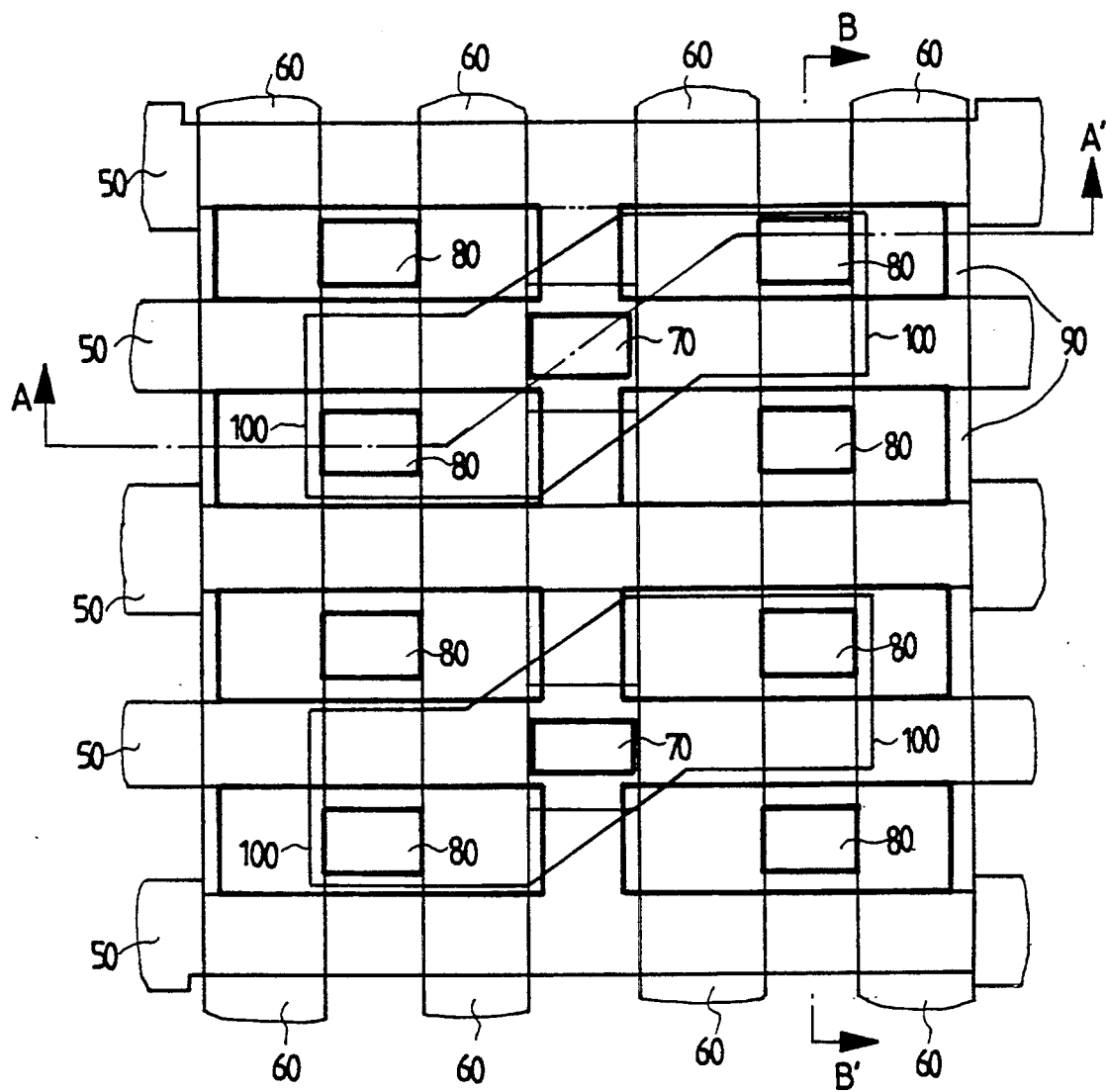
FIG. 1 is a front view of a DRAM cell to which the present invention is adapted.

FIG. 1 shows a DRAM cell to which the present invention is adapted. FIGS. 2A to 2L are sectional views of the DRAM cell taken along the section line A-A' of FIG. 1, showing a process for production of a stacked capacitor in accordance with a preferred embodiment of the present invention, while FIGS. 3A to 3L are sectional views of the DRAM cell taken along the section line B-B' of FIG. 1, showing the process of this invention. In the drawings, the reference numeral 50 denotes a bit line, 60 denotes a word line, 70 denotes a bit line contact, 80 denotes a charge storage electrode contact and 90 denotes a charge storage electrode.

Figure 2A:
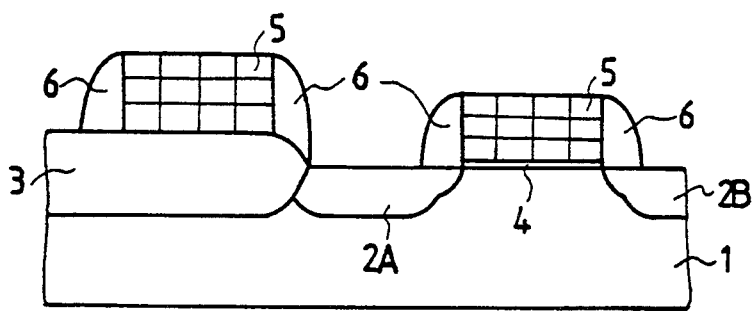
FIGS. 2A to 2L are sectional views of the DRAM cell taken along the section line A-A' of FIG. 1, respectively, showing a process for production of a stacked capacitor in accordance with a preferred embodiment of the present invention.
Figure 3A:
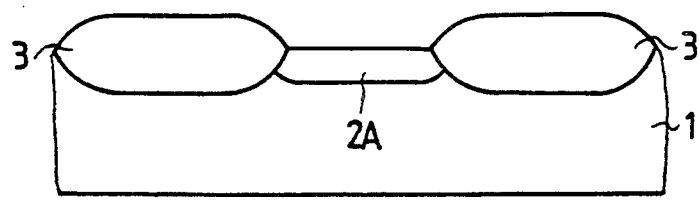
FIGS. 3A to 3L are sectional views of the DRAM cell taken along the section line B-B' of FIG. 1, respectively, showing the process for production of the stacked capacitor in accordance with the preferred embodiment of the present invention.

In the stacked capacitor production process of the present invention, a device separating oxide layer 3, a gate oxide layer 4, a gate electrode 5, a spacer oxide layer 6 and a source region 2A and a drain region 2B are first formed on a semiconductor substrate 1 using a conventional technique, respectively, as shown in FIG. 2A. Here, FIG. 3A shows the sectional structure of the DRAM cell, treated by the same step of FIG. 2A, taken along the section line B-B ' of FIG. 1, however, the gate oxide layer 4, the gate electrode 5 and the spacer oxide layer 6 are not shown in FIG. 3A.

Figure 2B:
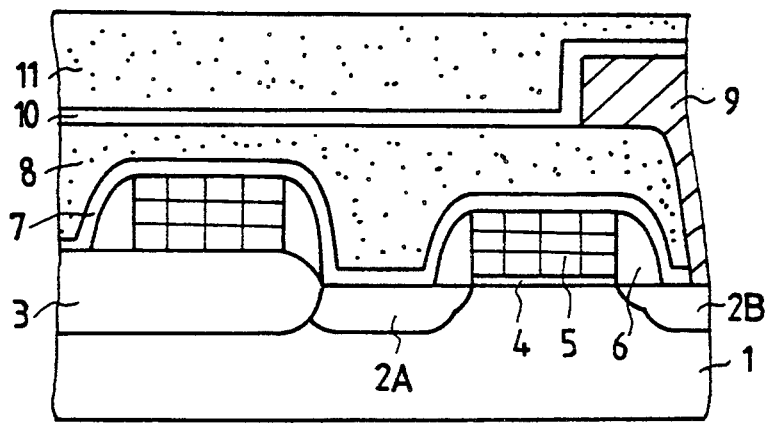
Figure 3B:
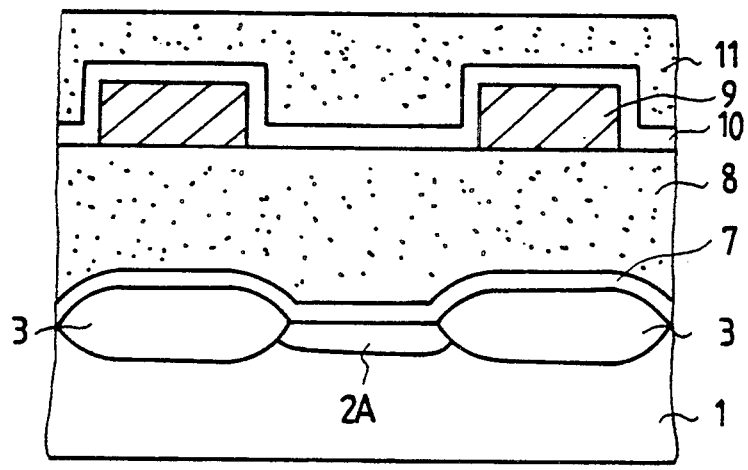

Thereafter, a first oxide layer 7 and a first borophosphosilicate glass (hereinafter, referred to simply as "BPSG") layer 8 are formed one after another on the result structure of FIG. 2A as shown in FIG. 2B. The first BPSG layer 8 is, thereafter, flattened prior to patterning of the bit line contacts. The patterning of the bit line contacts is followed by serial etching of the first BPSG layer 8 and the first oxide layer 7 on the drain region 2B. As a result of the above serial etching, a bit line 9 is formed. Upon finishing the forming step for the bit line 9, a second oxide layer 10 and a second BPSG layer 11 are formed on the result structure. FIG. 3B corresponding to FIG. 2B shows a sectional structure in that the first oxide layer 7 and the first BPSG layer 8 are formed on the result structure of FIG. 3A and, thereafter, the bit line 9, the second oxide layer 10 and the second BPSG layer 11 are formed one after another on the first BPSG layer 8.

Figure 2C:
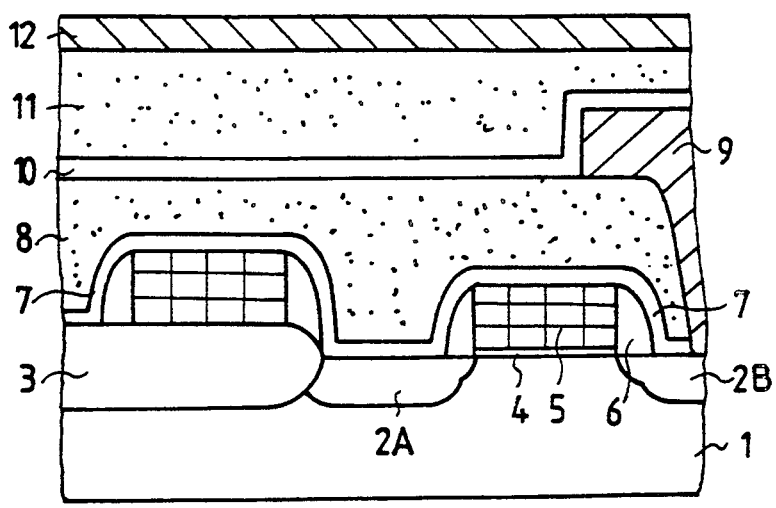
Figure 3C:
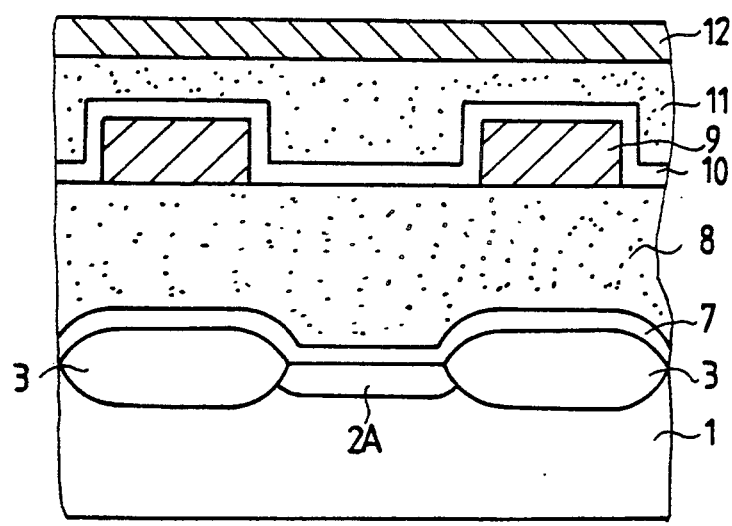

FIGS. 2C and 3C show a step in that the second BPSG layer 11 is flattened and, thereafter, a first polysilicon layer 12 is formed on the flattened BPSG layer 11. Here, the first polysilicon layer 12 is used as an etching mask in etching of the lower second BPSG layer 11 and constitutes part of the charge storage electrodes in the later step of forming the charge storage electrodes.

Figure 2D:
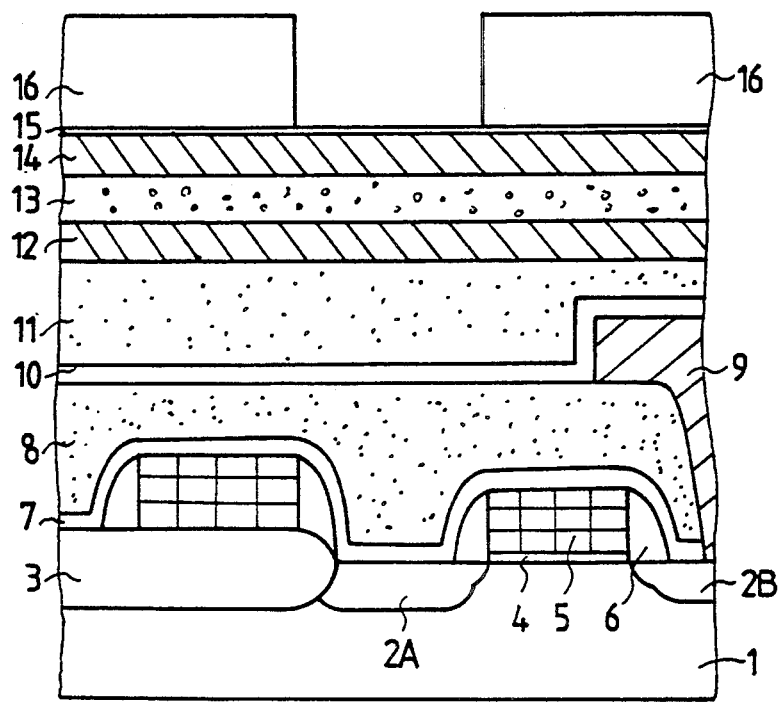
Figure 3D:
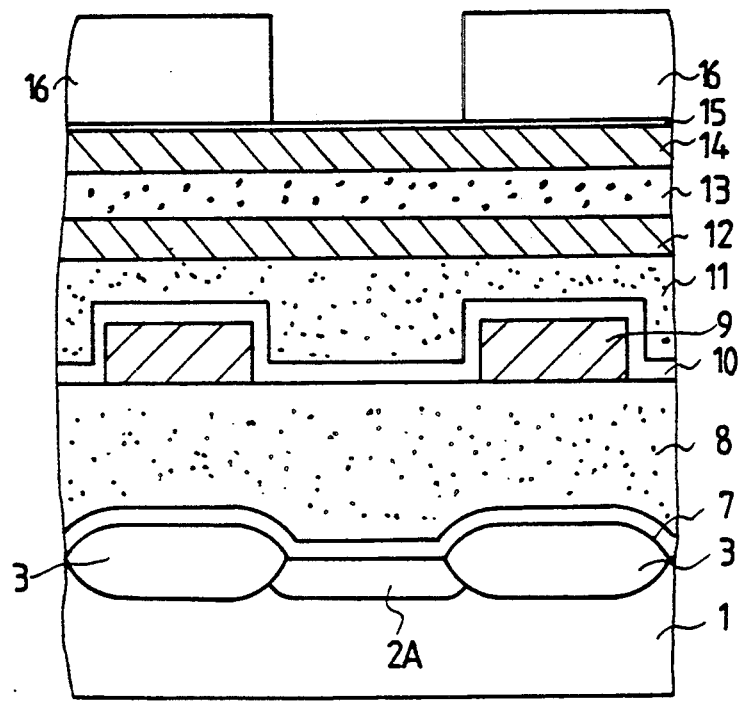

Turning to FIGS. 2D and 3D, a first buffer oxide layer 13, a second polysilicon layer 14 and a first nitride layer 15 are formed one after another on the first polysilicon layer 12 of the result structure of FIGS. 2C and 3C. A first photoresist film 16 is applied on the first nitride layer 15 and, thereafter, developed using a storage node contact mask. Here, in the same manner as the first polysilicon layer 12, the second polysilicon layer 14 is used as an etching mask in etching of the tower first buffer oxide layer 13 and constitutes part of the charge storage electrodes in the later step of forming the charge storage electrodes.

Figure 2E:
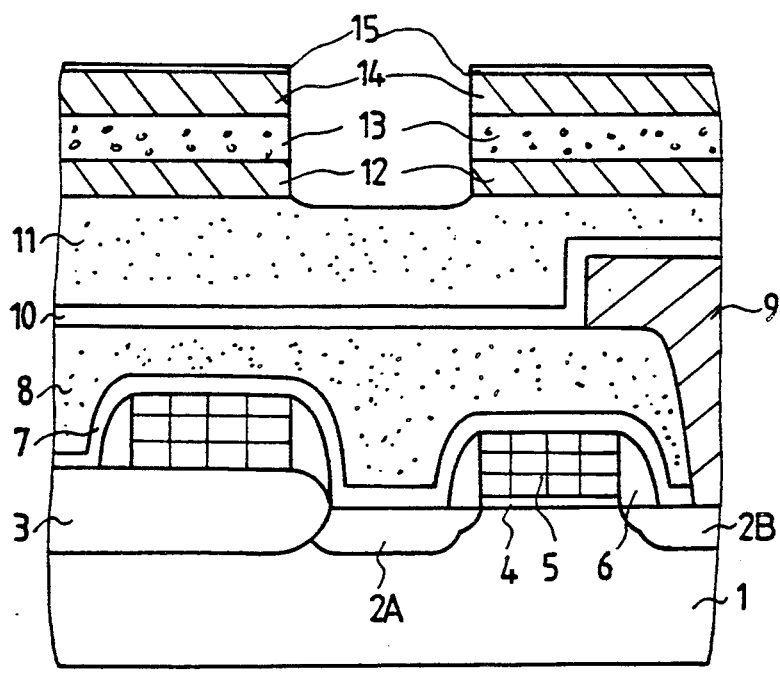
Figure 3E:
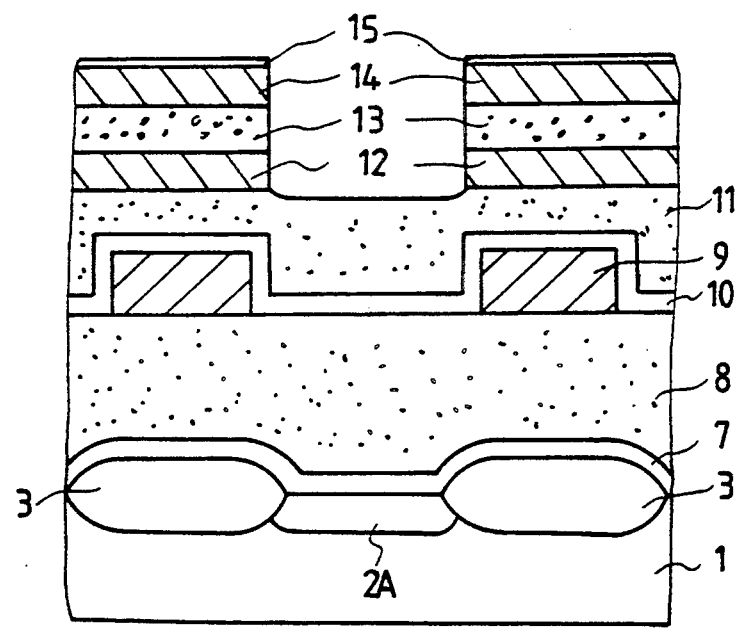

Thereafter, a dry etching is carried out using the developed first photoresist film 16 as a mask, thus to remove the exposed sections of the first nitride layer 15, the second polysilicon layer 14, the first buffer oxide layer 13 and the first polysilicon layer 12 as shown in FIGS. 2E and 3E.

Figure 2F:
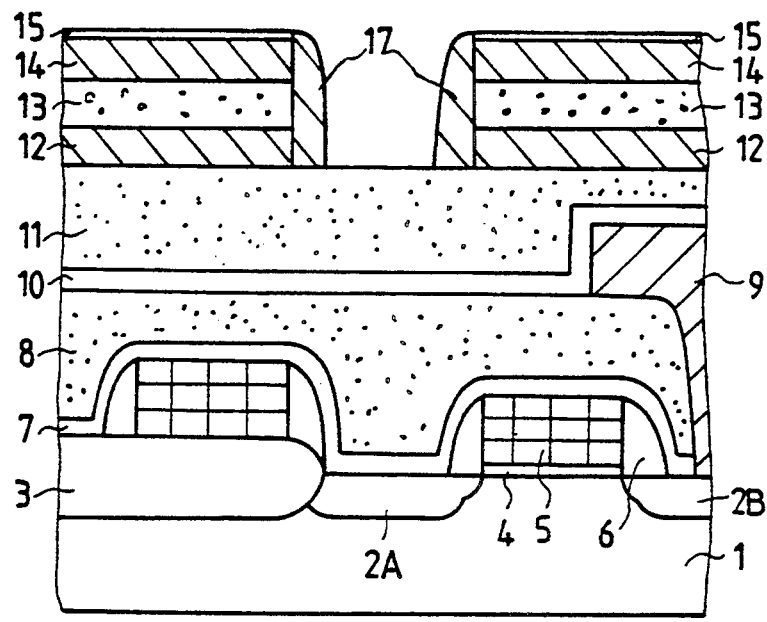
Figure 3F:
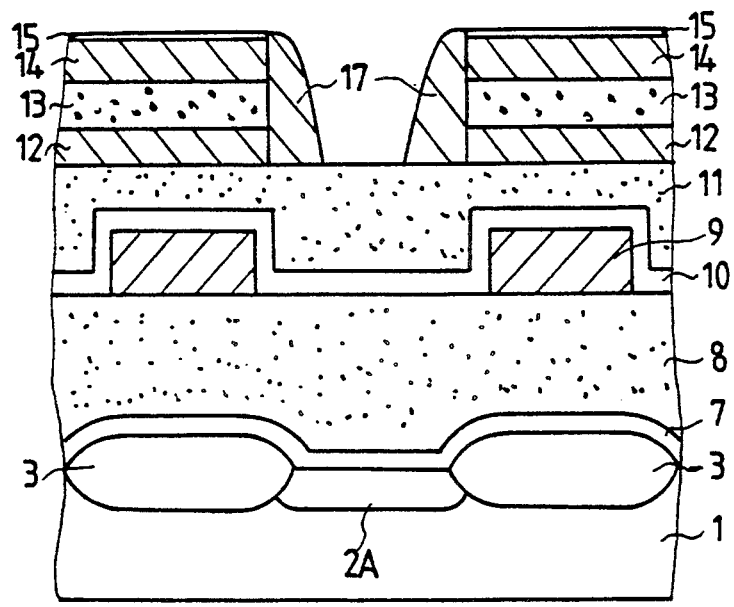

The dry etching of FIGS. 2E and 3E is followed by an etching for forming a spacer polysilicon layer 17 as shown in FIGS. 2F and 3F. In order to carry out this etching, a polysilicon is applied on the result structure, which is partially exposed to the outside as a result of the dry etching of FIGS. 2E and 3E, prior to she etching. This etching step of FIGS. 2F and 3F is carried out to reduce the size of the contact provided by the dry etching of FIGS. 2E and 3E.

Figure 2G:
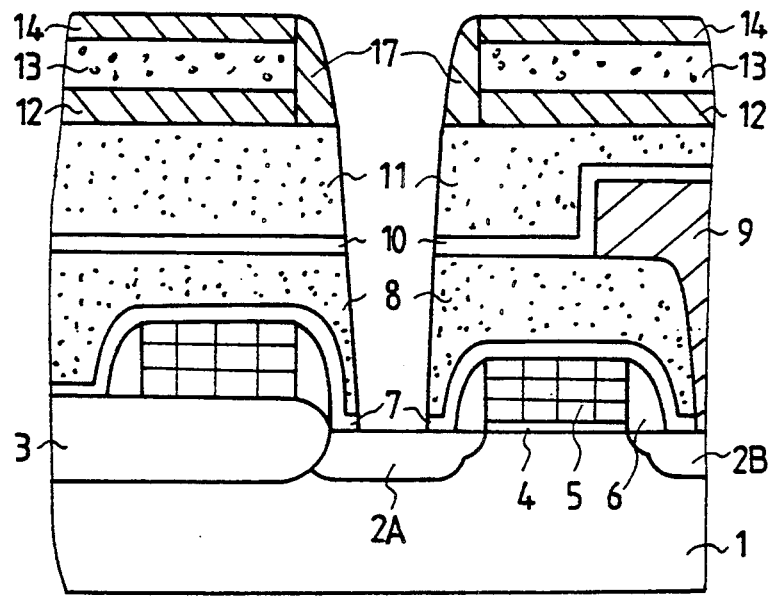
Figure 3G:
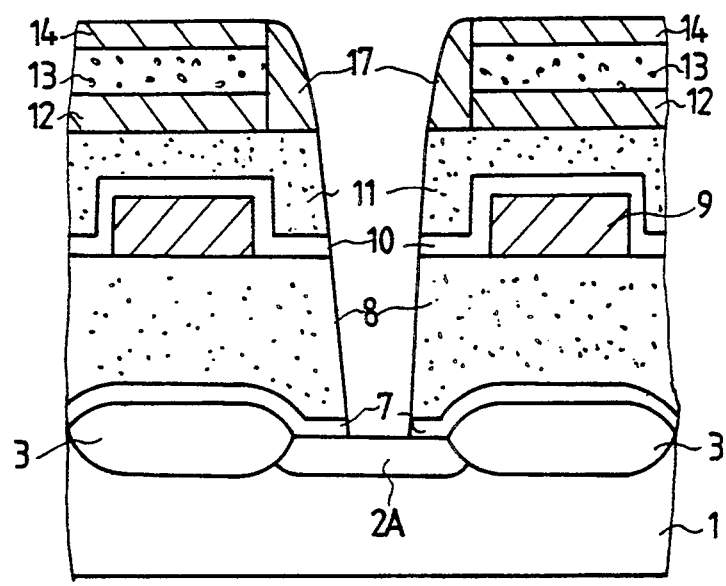

Thereafter, the first nitride layer 15, the second BPSG layer 11, the second oxide layer 10, the first BPSG layer 8 and the first oxide layer 7 are etched as shown in FIGS. 2G and 3G. As a result of this etching using a characteristic in that an etching selection ratio (about 30:1) of an oxide layer to a polysilicon layer is considerably higher, the storage node contact is opened.

Figure 2H:
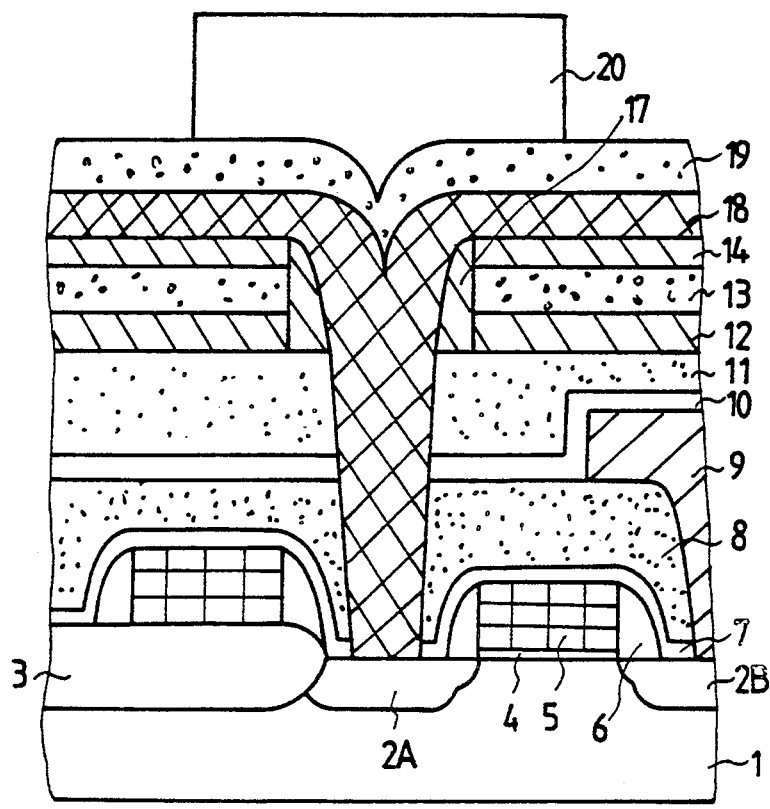
Figure 3H:
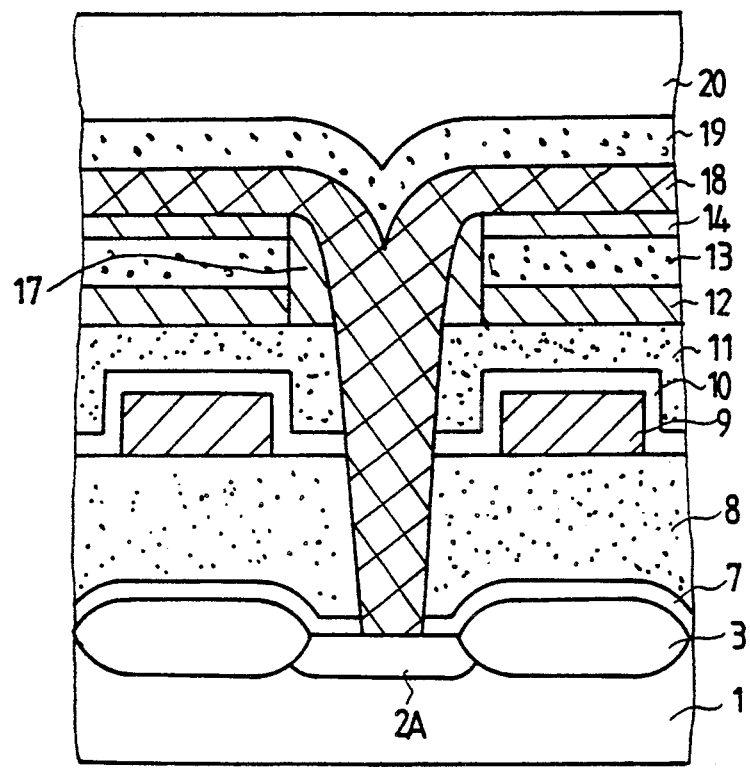

Turning to FIGS. 2H and 3H, a third polysilicon layer 18, otherwise stated, a first mask polysilicon layer or a conductive layer for the charge storage electrodes, and a second buffer oxide layer 19 are formed one after another on the exposed result structure of FIGS. 2G and 3G. Upon finishing the serial forming of the third polysilicon layer 18 and the second buffer oxide layer 19, a second photoresist film 20 is formed on the second buffer oxide layer 19.

Figure 2I:
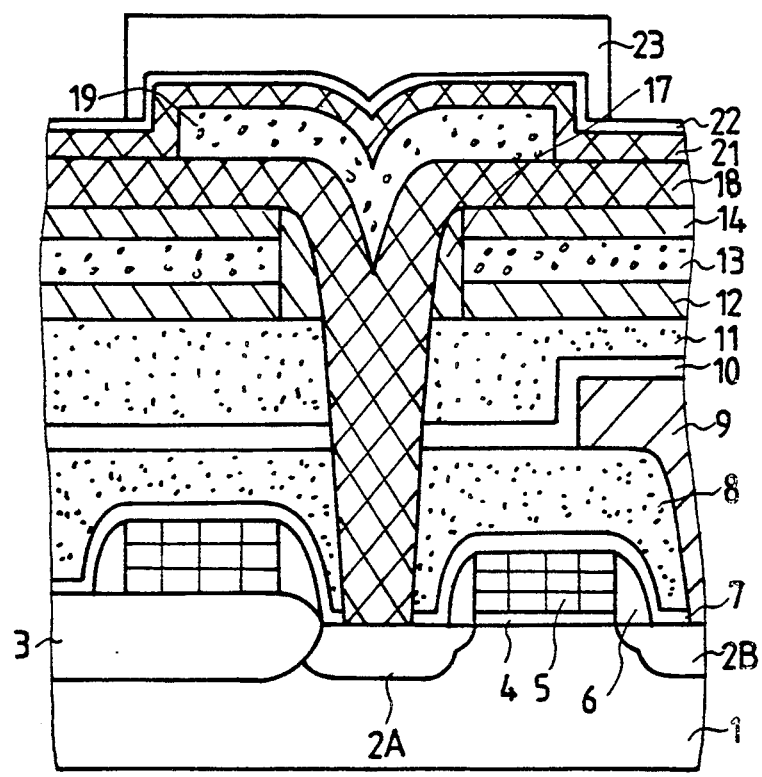
Figure 3I:
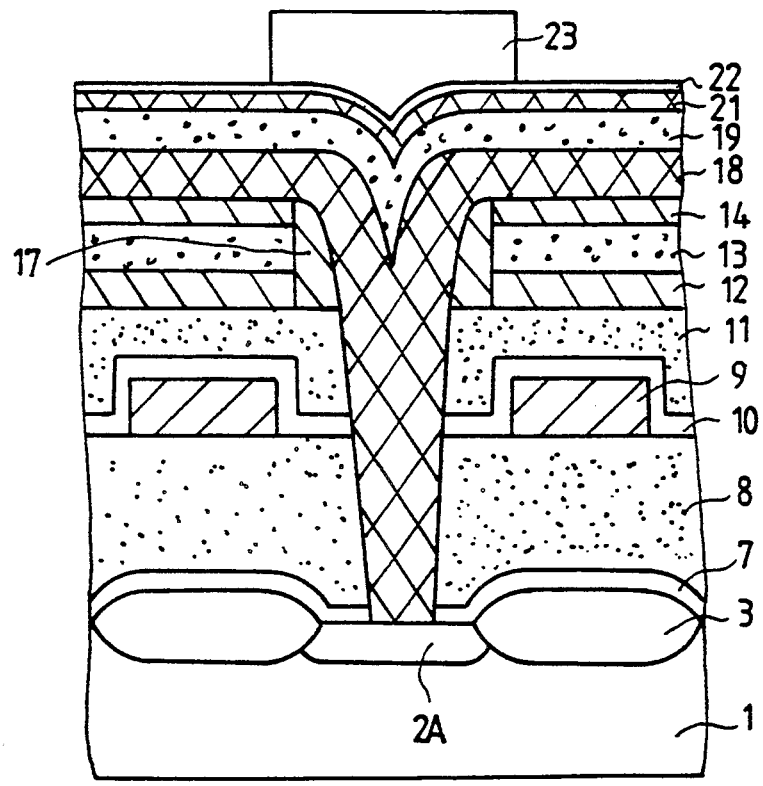

The forming step of the second photoresist film 20 is followed by trimming of the second buffer oxide layer 19 to a predetermined size using the second photoresist film 20 as shown in FIGS. 2I and 3I. As shown in these drawings, FIGS. 2I and 3I, a fourth polysilicon layer 21 or a second mask polysilicon layer, which is also used as a conductive layer for the charge storage electorodes, and a second nitride layer 22 are formed on the exposed result structure of the trimming of the second buffer oxide layer 19. In addition, a third photoresist film 23 is formed, using a storage node mask, on a predetermined position of the result structure. At this time, it should be noted that the second nitride layer 22 which is used as an etching resist material for the conductive layers may be substituted with an oxide layer and the third photoresist film 23 is such sized in its width that it completely covers the second buffer oxide layer 19 as shown in FIG. 2I.

Figure 2J:
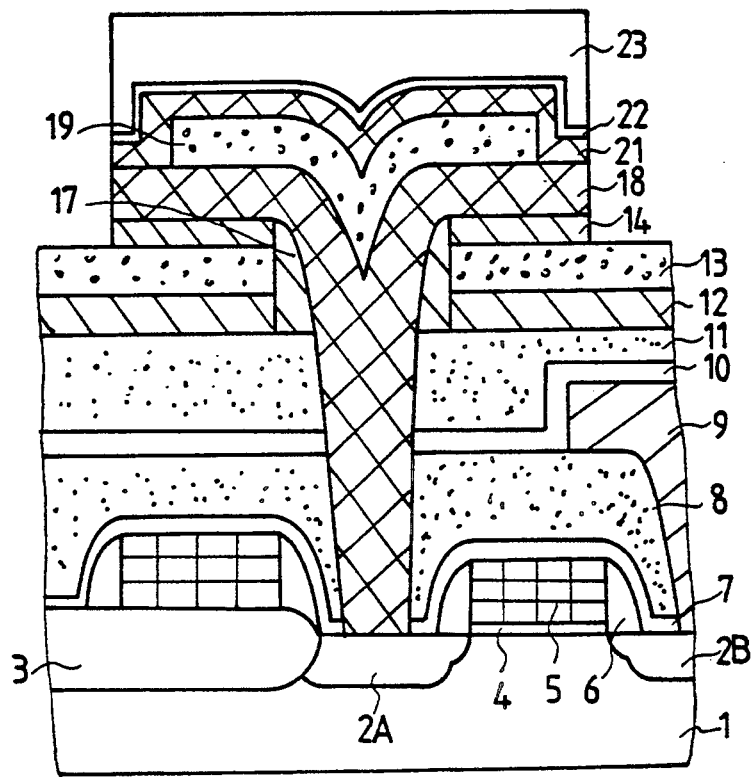
Figure 3J:
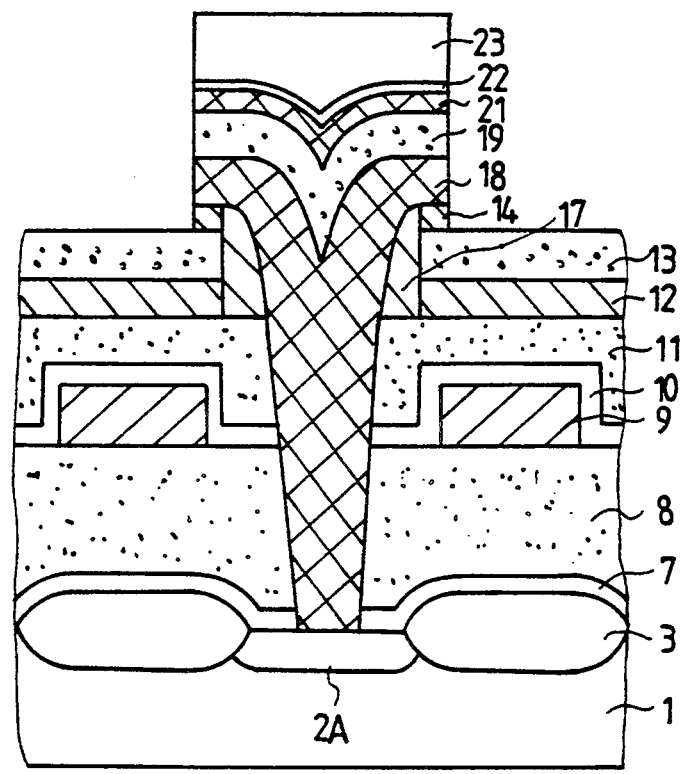

Thereafter, the second nitride layer 22, the charge storage electrode layer or the fourth polysilicon layer 21, another charge storage electrode layer or the third polysilicon layer 18 and the second polysilicon layer 14 are etched one after another using the third photoresist film 23 as shown in FIG. 2J. At this time, the etching is carried out such that the second nitride layer 22, the charge storage electrode polysilicon layer 21, the second buffer oxide layer 19, the charge storage electrode polysilicon layer 18 and the second polysilicon layer 14 are etched one after another using the third photoresist film 23 as shown in FIG. 3J.

Figure 2K:
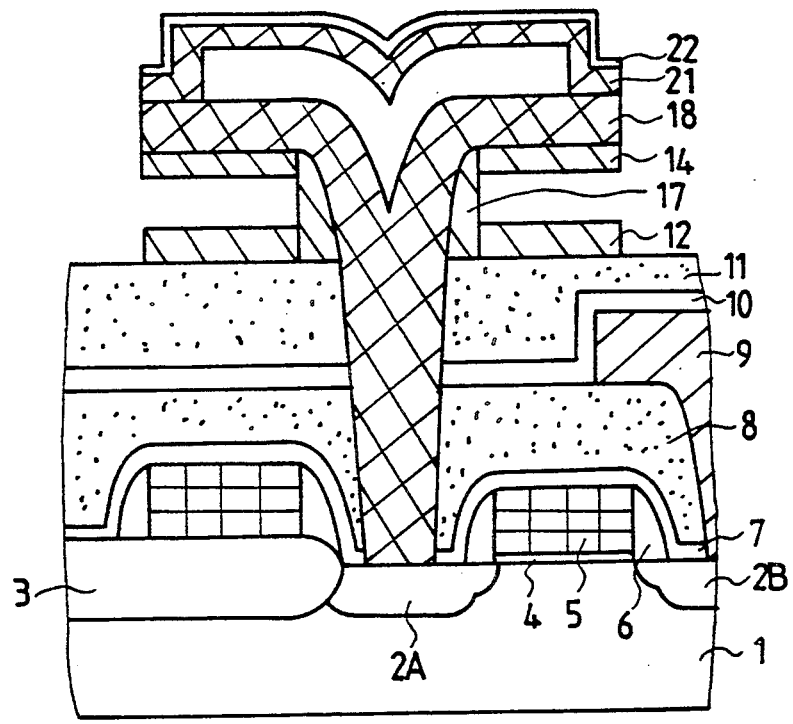
Figure 3K:
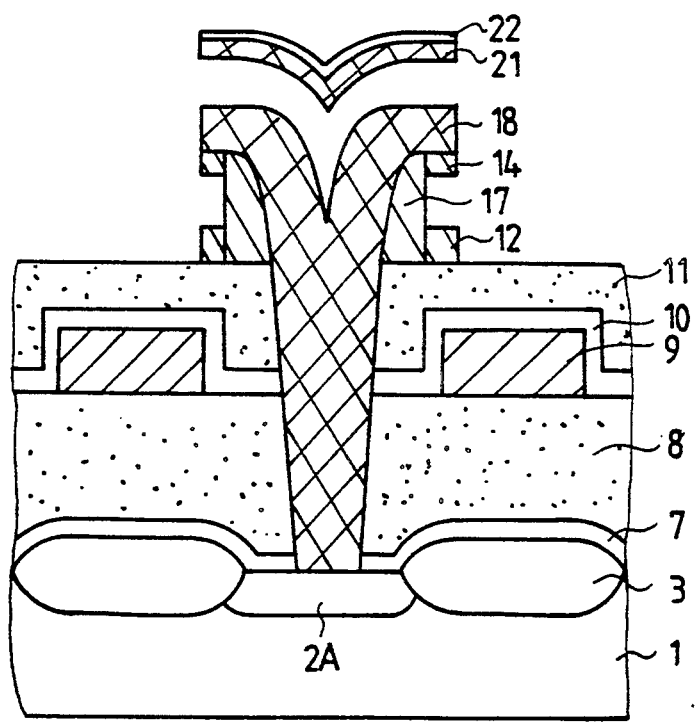

The etching step of FIGS. 2J and 2J is followed by removing of the third photoresist film 23 as shown in FIGS. 2K and 3K. When the removing of the photoresist film 23 is finished, a wet etching is carried out to remove the first and second buffer oxide layers 13 and 19. Thereafter, the first polysilicon layer 12 is partially etched using a characteristic of higher etching selection ratio (not less than 30:1) of a polysilicon layer to a nitride layer, thus to expose a predetermined section of the second BPSG layer 11 to the outside.

Figure 2L:
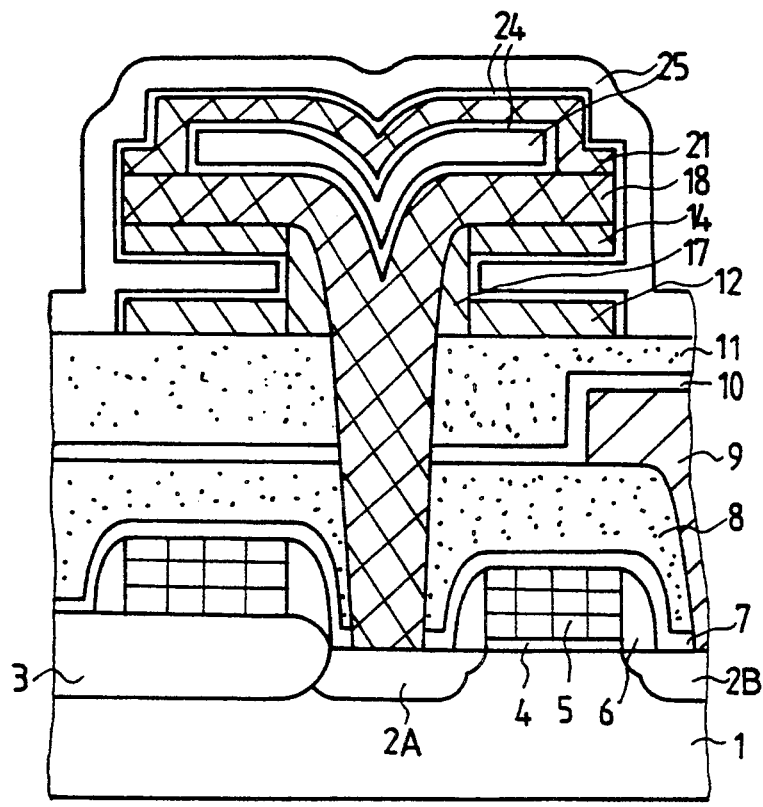
Figure 3L:
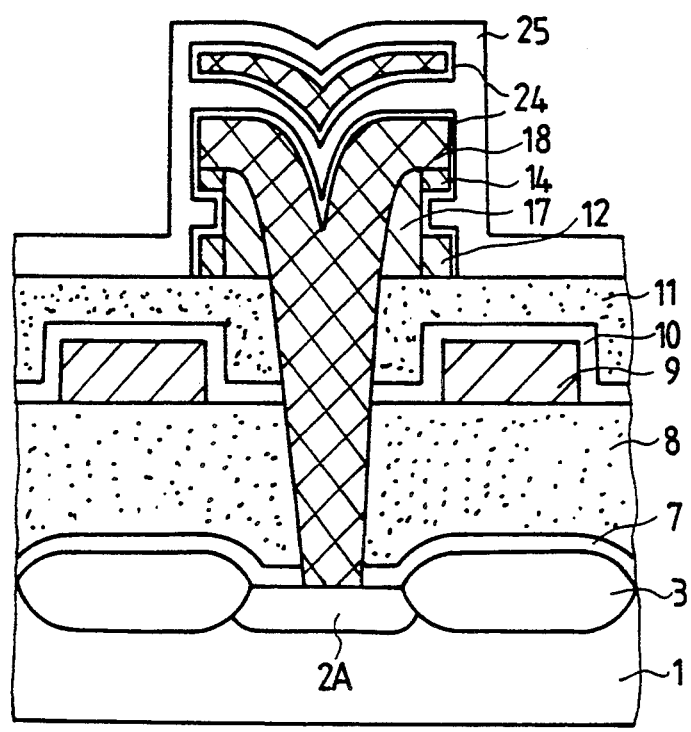

The process for production of the stacked capacitor of this invention is finished by forming a plate electrode 25 on the structure as shown in FIGS. 2L and 3L. In this last step, the second nitride layer 22 is removed by etching and, thereafter, a capacitor dielectric layer 24 is applied prior to forming the plate electrode 25 in whole on the exposed result structure. Hence, the desired storage contact is formed and the desired stacked capacitor is completely produced.

In the above steps, all the polysilicon layers are formed using an in-situ doped polysilicon.

As described above, in accordance with a process for production of a stacked capacitor of a semiconductor device of the present invention, first and second mask polysilicon layers, which are used in opening of a storage node contact, are used in forming of a contact and also used as conductive layers for charge storage electrodes. In addition, the process of this invention provides a capacitor of a semiconductor device with a larger storage node capacitance in a relatively smaller cell area, using the characteristic of a higher etching selection ratio (about, 30:1) of an oxide layer to a polysilicon layer and of a higher etching selection ratio (not less than 30:1) of the polysilicon layer to a nitride layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process for production of a stacked capacitor of a semiconductor device comprising the steps of:

a) forming a first insulating layer and a second insulating layer on a transistor structure one by one, said transistor structure resulting from forming of a device separating oxide layer, a gate oxide layer, a gate electrode, a spacer oxide layer, a source region and a drain region on a semiconductor substrate;

b) forming a bit line, contacting with said drain region, by etching said second insulating layer and said first insulating layer on said drain region after patterning of a bit line contact and, thereafter, forming a third insulating layer and a fourth insulating layer on the result structure one by one;

c) forming a first conductive layer, a first buffer oxide layer, a second conductive layer and a fifth insulating layer on the result structure of the b) step one by one and, thereafter, developing a first photoresist film used as a storage node contact mask;

d) etching said fifth insulating layer, said second conductive layer, said first buffer oxide layer and said first conductive layer one by one and, thereafter, removing said first photoresist film;

e) forming a conductive layer on the result structure of the d) step and, thereafter, etching the result structure entirely for forming a spacer on said structure;

f) etching said fourth insulating layer, said third insulating layer, said second insulating layer and said first insulating layer one by one, thereby forming a contact hole exposing said source region to the outside;

g) forming a third conductive layer and a second buffer oxide layer on the structure resulting from) step f) one by one and, thereafter, etching said structure to form said second buffer oxide layer with a width and length;

h) forming a fourth conductive layer and a sixth insulating layer on the resulting structure of step g) one by one and, thereafter, forming a second photoresist film having a width and length larger than said second buffer oxide layer;

i) etching said sixth insulating layer, said fourth conductive layer, said third conductive layer and said second conductive layer;

j) removing said second photoresist film and removing all of said first and second buffer oxide layers and, thereafter, partially etching said first conductive layer using the remaining sixth insulating layer as an etch barrier; and k) etching said sixth insulating layer for removing this layer and, thereafter, applying a capacitor dielectric layer and forming a plate electrode.

2. The process according to claim 1, wherein the step a) of forming said first and second insulating layers further comprises a step of flattening said second insulating layer.

3. The process according to claim 1, wherein the step b) of forming said third and fourth insulating layers further comprises a step of flattening said fourth insulating layer.

4. The process according to claim 1, wherein said first and third insulating layers are oxide layers, respectively.

5. The process according to claim 1, wherein said second and fourth insulating layers are borophosphosilicate glass (BPSG) layers, respectively.

6. The process according to claim 1, wherein said fifth insulating layer is a nitride layer.

7. The process according to claim 1, wherein said sixth insulating layer is a nitride layer.

8. The process according to claim 1, wherein said sixth insulating layer is an oxide layer.

9. The process according to claim 1, wherein said first to fourth conductive layers and said spacer are polysilicon layers, respectively.

10. The process according to claim 1, wherein said first conductive layer of the j) step is partially etched using a characteristic of a high etching selection ratio of said first conductive layer to said sixth insulating layer.

* * * * *